United States Patent
Chaichanavong et al.

(10) Patent No.: US 7,425,907 B1
(45) Date of Patent: Sep. 16, 2008

(54) RATE-7/8 DIRECT-CURRENT FREE AND RUNLENGTH LIMITED CODE

(75) Inventors: Panu Chaichanavong, Mountain View, CA (US); Zining Wu, Los Altos, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 11/649,486

(22) Filed: Jan. 4, 2007

Related U.S. Application Data

(60) Provisional application No. 60/783,943, filed on Mar. 20, 2006.

(51) Int. Cl.
*H03M 7/00* (2006.01)
(52) U.S. Cl. .......................................... 341/59; 341/58
(58) Field of Classification Search .................. 341/58, 341/59, 100, 101; 714/759
See application file for complete search history.

(56) References Cited

U.S. PATENT DOCUMENTS

| | | | |
|---|---|---|---|
| 6,337,909 B1 * | 1/2002 | Vanstone et al. ............... 380/28 |
| 6,425,107 B1 * | 7/2002 | Caldara et al. ............... 714/759 |
| 6,480,125 B2 * | 11/2002 | Rub et al. ...................... 341/50 |
| 7,149,955 B1 * | 12/2006 | Sutardja et al. ............. 714/809 |
| 7,218,255 B1 * | 5/2007 | Feng et al. ..................... 341/58 |

OTHER PUBLICATIONS

K.A.S. Inmink Codes for Mars Data Storage Systems; pp. 221-223.
Widmer et al; A DC-Balanced, Partitioned-Block, 8B/10B Transmission Code; BIM J. Res. Develop. vol. 27, No. 5, Sep. 1983; pp. 440-451.

* cited by examiner

*Primary Examiner*—Brian Young

(57) ABSTRACT

A run-length limited (RLL) DC-free encoder includes a determination module that receives input words and that determines whether each input word is a member of one of a first input set and a second input set, a first mapping module that maps the first ones of the input words of the first input set to corresponding output words that are run-length limited and DC-free, a second mapping module that maps the second ones of the input words of the second input set to corresponding output words that are run-length limited and have a negative digital sum, and an inverter module that selectively inverts the output words from the second mapping module based on a cumulative digital sum of the output words.

50 Claims, 12 Drawing Sheets

FIG. 4

| Hamming Weight | 0 | 1 | 2 | 3 | 4 | 5 | 6 | 7 | 8 |
|---|---|---|---|---|---|---|---|---|---|
| Word Count | 0 | 0 | 16 | 48 | 68 | 48 | 16 | 0 | 0 |

→ 196 Words Total

FIG. 6

| y | h(x) for d=0 | h(x) for d=1 | Remark |
|---|---|---|---|
| 0000000 | 10010100 | 10011000 | (1 word) |
| 0000111 | 01010100 | 01011000 | (1 word) |
| $y_1y_2y_3y_4$000 | $y_1y_2y_3y_4$0001 | $y_1y_2y_3y_4$0010 | $y_1y_2y_3y_4 \neq 0000$ (10 words) |
| $y_1y_2y_3y_4y_5y_6y_7$ | $y_1y_2y_3y_4y_5y_6y_7$0 | $y_1y_2y_3y_4y_5y_6y_7$1 | $y_1y_2y_3y_4 \neq 0000$ and $y_5y_6y_7 \neq 000$ (12 words) |
| 000$y_5y_6y_7$ | $y_5y_6y_7$00100 | $y_5y_6y_7$01000 | $y_5y_6y_7 \neq 000, 111$ (6 words) |

RATE-7/8 DIRECT-CURRENT FREE AND RUNLENGTH LIMITED CODE

CROSS-REFERENCE TO RELATED APPLICATIONS

This application claims the benefit of U.S. Provisional Application No. 60/783,943, filed on Mar. 20, 2006. The disclosure of the above application is incorporated herein by reference in its entirety.

FIELD

The present disclosure relates to networks, and more particularly to data coding in physical coding sublayers of physical layer devices in network devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a layered network model 10 is shown. Network model 10 includes a physical layer 12 that transmits and receives data over a communication channel 14. Examples of channel 14 include copper lines, fiber optic links, wireless links, and the like. Physical layer 12 can include an isolation sublayer 16; such as a transformer that isolates DC signals in channel 14 from other sublayers of physical layer 12. An amplification sublayer 18 amplifies signals that are received from channel 14 and amplifies signals that are transmitted onto channel 14. A filtering sublayer 20 communicates with amplification sublayer 18 and isolates signals of interest from noise and/or other signals that may appear on channel 14. An analog to digital conversion sublayer 22 converts data between a digital format that is employed by the other layers of network model 10 and an analog format that is employed by channel 14. The isolation sublayer 16 may pose limitations to the bandwidth through physical layer 12.

SUMMARY

A run-length limited (RLL) DC-free encoder includes a determination module that receives input words and that determines whether each input word is a member of one of a first input set and a second input set, a first mapping module that maps the first ones of the input words of the first input set to corresponding output words that are run-length limited and DC-free, a second mapping module that maps the second ones of the input words of the second input set to corresponding output words that are run-length limited and have a negative digital sum, and an inverter module that selectively inverts the output words from the second mapping module based on a cumulative digital sum of the output words.

In other features the second mapping module determines the Hamming weight of each of the second ones of the input words of the second input set and maps each of the second ones of the input words to the corresponding output word based on the Hamming weight of the input word. The output words are encoded in a non-return to zero (NRZ) format. The input words are 7-bit words and the output words are 8-bit words. The first mapping module appends one of a 1 and a 0 to each 7-bit word in the first input set based on the Hamming weight of the 7-bit word. The second mapping module includes a table of functions that is indexed by variables y and d, wherein the second mapping module sets y=x and d=0 when H(x) is less than or equal to three and sets y= and d=1 when H(x) is greater than or equal to four and maps y to one of the output words based on the function selected from the table based on y and d, wherein x is one of the 7-bit words, and wherein H(x) is the Hamming weight of x. The first and second mapping modules employ respective block codes.

A decoder includes a determination module that receives encoded input words and that determines whether a Hamming weight of the input words is equal to a predetermined Hamming weight, a first mapping module that maps the input words to first corresponding output words when the Hamming weights of the input words are equal to the predetermined Hamming weight, and a second mapping module that maps the input words to second corresponding output words when the Hamming weights of the input words are not equal to the predetermined Hamming weight.

In other features the second mapping module includes an inverter that inverts the input words when the Hamming weights of the input words exceed the predetermined Hamming weight. The second mapping module maps the inverted input words to the corresponding output words when the Hamming weights of the input words exceed the predetermined Hamming weight. The output words are encoded in a non-return to zero (NRZ) format. The input words are 8-bit words and the output words are 7-bit words. The first mapping module deletes a predetermined bit from the input words. The first mapping module selectively inverts remaining bits of the input words based on the deleted bit. The first and second mapping modules employ respective block codes.

A run-length limited (RLL) DC-free encoding method includes receiving input words and determining whether each input word is a member of one of a first input set and a second input set, mapping the first ones of the input words of the first input set to corresponding output words that are run-length limited and DC-free, mapping the second ones of the input words of the second input set to corresponding output words that are run-length limited and have a negative digital sum; and selectively inverting the output words from the second mapping module based on a cumulative digital sum of the output words.

In other features the method includes determining the Hamming weight of each of the second ones of the input words of the second input set and mapping each of the second ones of the input words to the corresponding output word based on the Hamming weight of the input word. The output words are encoded in a non-return to zero (NRZ) format. The input words are 7-bit words and the output words are 8-bit words. The method includes appending one of a 1 and a 0 to each 7-bit word in the first input set based on the Hamming weight of the 7-bit word. Mapping the second ones of the input words includes employing a table of functions that is indexed by variables y and d, setting y=x and d=0 when H(x) is less than or equal to three and setting y= and d=1 when H(x) is greater than or equal to four, and mapping y to one of the output words based on the function selected from the table based on y and d, wherein x is one of the 7-bit words, and wherein H(x) is the Hamming weight of x. Each of the mapping steps employ respective block codes.

A decoding method includes receiving encoded input words, determining whether Hamming weights of the input words are equal to a predetermined Hamming weight, mapping the input words to first corresponding output words when the Hamming weights of the input words are equal to the predetermined Hamming weight, and mapping the input words to second corresponding output words when the Hamming weights of the input words are not equal to the predetermined Hamming weight.

In other features the method includes inverting the input words when the Hamming weights of the input words exceed the predetermined Hamming weight. The method includes mapping the inverted input words to the corresponding output words when the Hamming weights of the input words exceed the predetermined Hamming weight. The output words are encoded in a non-return to zero (NRZ) format. The input words are 8-bit words and the output words are 7-bit words. The method includes deleting a predetermined bit from the input words. The method includes selectively inverting remaining bits of the input words based on the deleted bit. The mapping steps employ respective block codes.

A run-length limited (RLL) DC-free encoder includes determination means for receiving input words and determining whether each input word is a member of one of a first input set and a second input set, first mapping means for mapping the first ones of the input words of the first input set to corresponding output words that are run-length limited and DC-free, second mapping means for mapping the second ones of the input words of the second input set to corresponding output words that are run-length limited and have a negative digital sum, and inverter means for selectively inverting the output words from the second mapping module based on a cumulative digital sum of the output words.

In other features the second mapping means determines the Hamming weight of each of the second ones of the input words of the second input set and maps each of the second ones of the input words to the corresponding output word based on the Hamming weight of the input word. The output words are encoded in a non-return to zero (NRZ) format. The input words are 7-bit words and the output words are 8-bit words. The first mapping means appends one of a 1 and a 0 to each 7-bit word in the first input set based on the Hamming weight of the 7-bit word. The second mapping means includes a table of functions that is indexed by variables y and d, wherein the second mapping means sets y=x and d=0 when H(x) is less than or equal to three and sets y= and d=1 when H(x) is greater than or equal to four and maps y to one of the output words based on the function selected from the table based on y and d, wherein x is one of the 7-bit words, and wherein H(x) is the Hamming weight of x. The first and second mapping means employ respective block codes.

A decoder includes determination means for receiving encoded input words and determining whether Hamming weights of the input words are equal to a predetermined Hamming weight, first mapping means for mapping the input words to first corresponding output words when the Hamming weights of the input words are equal to the predetermined Hamming weight, and second mapping means for mapping the input words to second corresponding output words when the Hamming weights of the input words are not equal to the predetermined Hamming weight.

In other features the second mapping means includes inverter means for inverting the input words when the Hamming weights of the input words exceed the predetermined Hamming weight. The second mapping means maps the inverted input words to the corresponding output words when the Hamming weights of the input words exceed the predetermined Hamming weight. The output words are encoded in a non-return to zero (NRZ) format. The input words are 8-bit words and the output words are 7-bit words. The first mapping means deletes a predetermined bit from the input words. The first mapping means selectively inverts remaining bits of the input words based on the deleted bit. The first and second mapping means employ respective block codes.

A computer program for operating a run-length limited (RLL) DC-free encoder is executed by one or more processors. The computer program can reside on a computer readable medium such as but not limited to memory, non-volatile data storage and/or other suitable tangible storage mediums. The computer program includes receiving input words and determining whether each input word is a member of one of a first input set and a second input set, mapping the first ones of the input words of the first input set to corresponding output words that are run-length limited and DC-free, mapping the second ones of the input words of the second input set to corresponding output words that are run-length limited and have a negative digital sum; and selectively inverting the output words from the second mapping module based on a cumulative digital sum of the output words.

In other features the computer program includes determining the Hamming weight of each of the second ones of the input words of the second input set and mapping each of the second ones of the input words to the corresponding output word based on the Hamming weight of the input word. The output words are encoded in a non-return to zero (NRZ) format. The input words are 7-bit words and the output words are 8-bit words. The computer program includes appending one of a 1 and a 0 to each 7-bit word in the first input set based on the Hamming weight of the 7-bit word. Mapping the second ones of the input words includes employing a table of functions that is indexed by variables y and d, setting y=x and d=0 when H(x) is less than or equal to three and setting y= and d=1 when H(x) is greater than or equal to four, and mapping y to one of the output words based on the function selected from the table based on y and d, wherein x is one of the 7-bit words, and wherein H(x) is the Hamming weight of x. Each of the mapping steps employ respective block codes.

A computer program for decoding run-length limited (RLL) words is executed by one or more processors. The computer program can reside on a computer readable medium such as but not limited to memory, non-volatile data storage and/or other suitable tangible storage mediums. The computer program includes receiving encoded input words, determining whether Hamming weights of the input words are equal to a predetermined Hamming weight, mapping the input words to first corresponding output words when the Hamming weights of the input words are equal to the predetermined Hamming weight, and mapping the input words to second corresponding output words when the Hamming weights of the input words are not equal to the predetermined Hamming weight.

In other features the computer program includes inverting the input words when the Hamming weights of the input words exceed the predetermined Hamming weight. The computer program includes mapping the inverted input words to the corresponding output words when the Hamming weights of the input words exceed the predetermined Hamming weight. The output words are encoded in a non-return to zero (NRZ) format. The input words are 8-bit words and the output words are 7-bit words. The computer program includes deleting a predetermined bit from the input words. The computer program includes selectively inverting remaining bits of the input words based on the deleted bit. The mapping steps employ respective block codes.

Further areas of applicability of the present disclosure will become apparent from the detailed description provided hereinafter. It should be understood that the detailed description and specific examples, while indicating the preferred embodi-

BRIEF DESCRIPTION OF THE DRAWINGS

The present disclosure will become more fully understood from the detailed description and the accompanying drawings, wherein:

FIG. 4 is table of Hamming weight distributions in the 7/8 code;

FIG. 6 is a table of a subset of 7/8 code translations;

DETAILED DESCRIPTION

Figure 1:
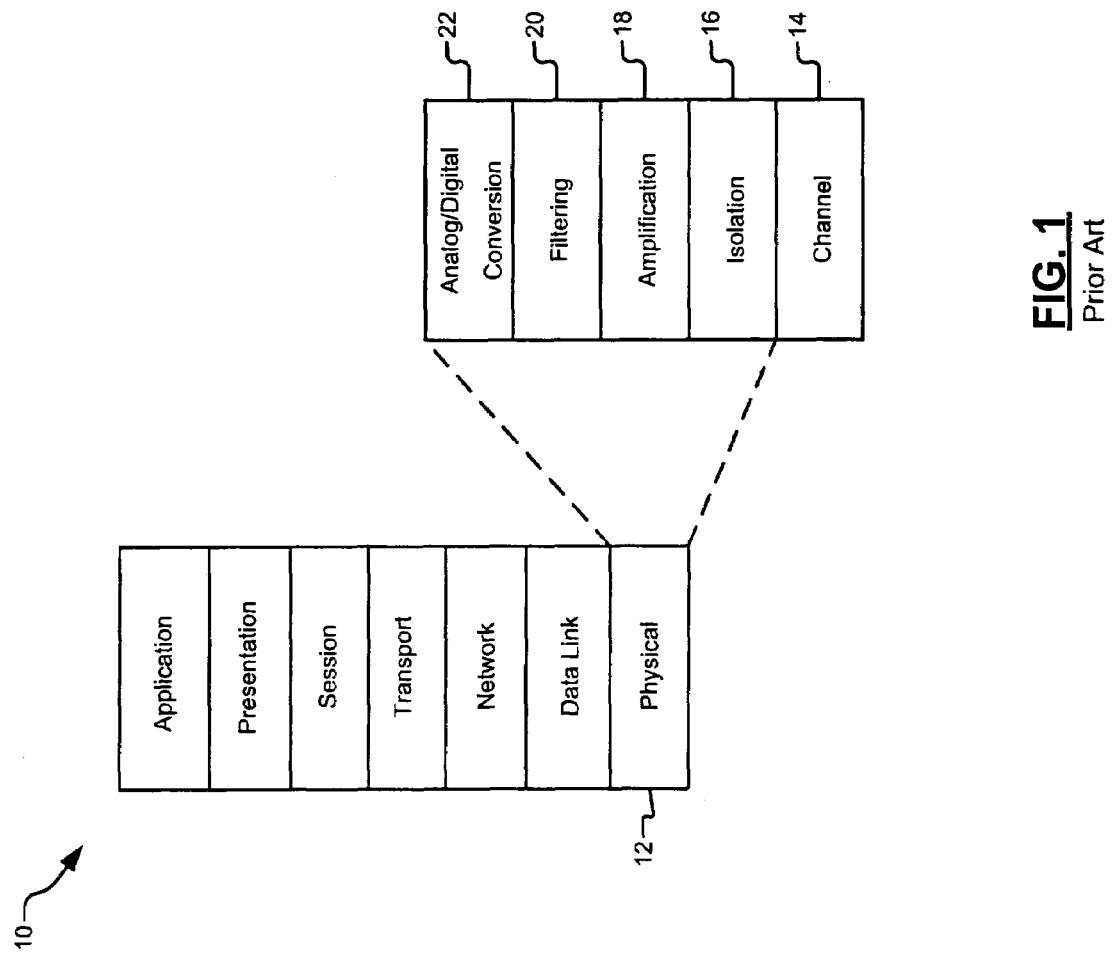
FIG. 1 is a functional block diagram of a computer network interface according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Overview

Figure 2:
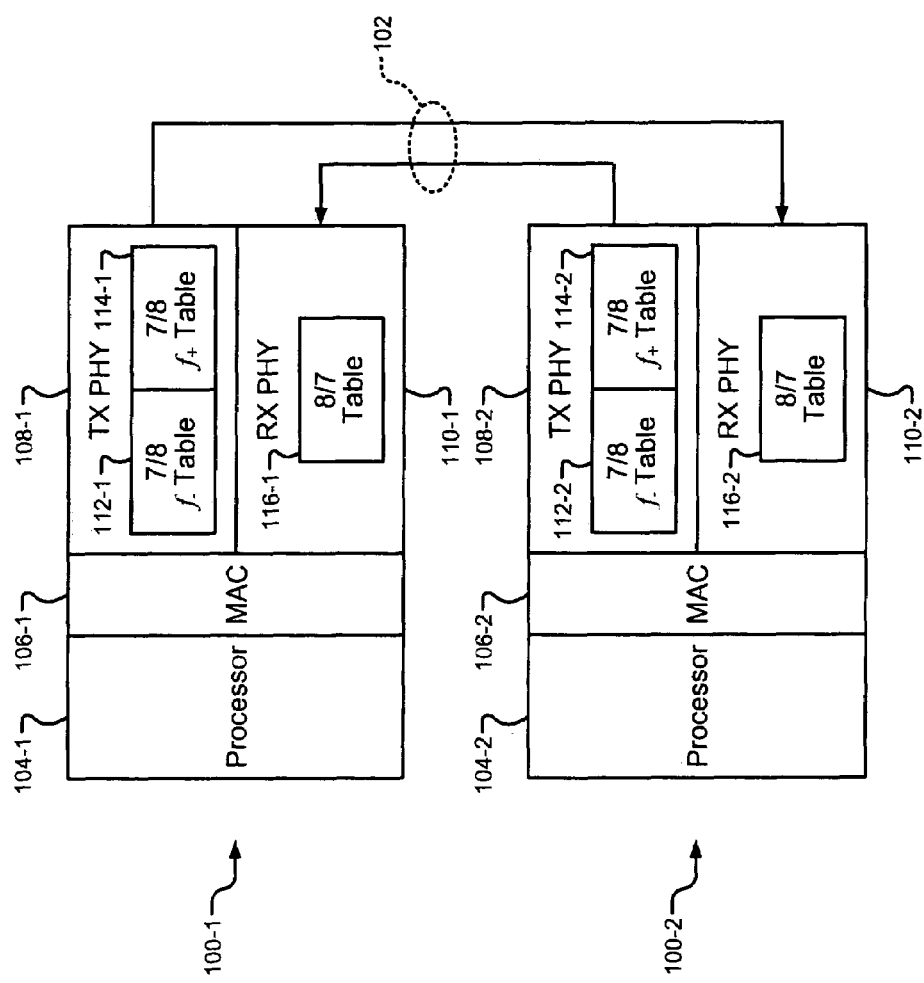
FIG. 2 is a functional block diagram of networked computers.

Referring now to FIG. 2, a functional block diagram is shown of a first computing host 100-1 and a second computing host 100-2, which are collectively referred to as hosts 100. Hosts 100 communicate with each other via a communication channel 102. In some embodiments channel 102 is a digital subscriber line (DSL), however other types of wired or wireless channels 102 may also be employed. Each host 100 includes a respective processor 104, a MAC 106, a transmit physical layer module (TX PHY) 108, and a receive physical layer module (RX PHY) 110. TX PHY 108 and RX PHY 110 can be combined to form a transceiver PHY.

Processors 104 send and receive data. Each MAC 106 forms packets based on the data that is being sent from its respective processor 104. Each MAC 106 also unpacks data from packets that are received from channel 102 and then communicates the unpacked data to its respective receiving processor 104. Each TX PHY 108 includes a first 7/8 lookup table 112 and second 7/8 lookup table 114 that are employed to encode data packets from the associated MAC 106. In some embodiments combinatorial logic and/or state-dependent logic can be employed to implement some or all of the coding that is provided by first and second 7/8 lookup tables 112,114. Each RX PHY 110 includes a respective 8/7 lookup table that is employed to decode 8-bit data words that arrive via channel 102. In some embodiments combinatorial logic and/or state-dependent logic can be employed to implement some or all of the coding that is provided by 8/7 lookup table 116.

7/8 DC-Free RLL Code

The code that is employed by TX PHY 108 and RX PHY 110 will now be described in more detail. The code is a rate-7/8 direct-current (DC)-free runlength limited (RLL) code with a maximum runlength of 6. The digital sum variation of the code is 15, so the code is DC-free. It should be noted that in the discussion below $\bar{x}$ is the binary inverse of a word x.

The ensuing description of the 7/8 code employs the following nomenclature. A Hamming weight of a binary word w, denoted by H(w), is the number of 1's in w. A digital sum of the binary word w, denoted by DS(w), is defined as the number of 1's in w minus the number of 0's in w. Note that DS(w)=2H(w)−|w|, where |w| is the length of w. The digital sum variation (DSV) of the binary word w is defined as $$\max_i DS(w_1^i) - \min_i DS(w_1^i) + 1,$$

where $w_l^i$ is the prefix length i of w. The DSV can be defined for a right infinite sequence as well. An infinite sequence is DC-free if its DSV is bounded.

Note that if an infinite sequence has a finite DSV N then its spectrum has a null at DC with the cutoff frequency $\omega_0$ given by $$1\frac{1}{2\sqrt{2(1-\cos(\omega_0))}} \leq \frac{1}{12}(N+1)^2 - \frac{1}{2\sin^2\frac{\pi}{N+1}} + \frac{1}{6}.$$

For an ensemble of maxentropic sequences, the above equation becomes an equality with both sides being the sum variance. With N=15, the 7/8 DC-free RLL code has cutoff frequency $\omega_0$=0.0598. If the transmission rate is, by example, 1 GHz and a high-pass filter is used, then the high-pass cutoff must be much smaller than 1000×2×0.0598=120 MHz to limit signal distortion.

Figure 3:
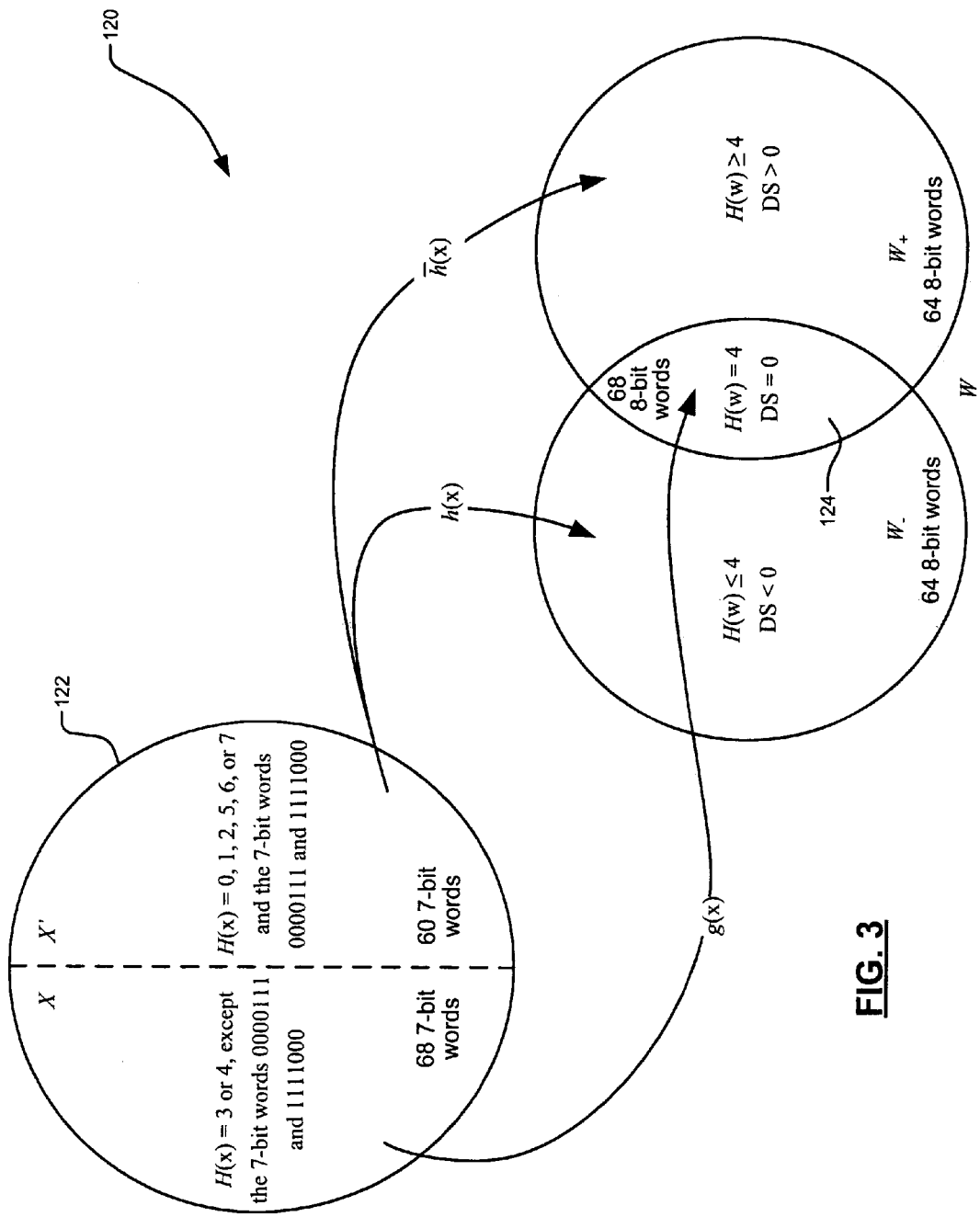
FIG. 3 is Venn diagram of input and output sets of a 7/8 code.

Referring now to FIG. 3, a Venn diagram 120 represents the 7/8 mapping scheme. A source set 122 includes all 128 possible 7-bit words x. Each 7-bit word x is associated with one of a subset X and a subset X'. Subsets X and X' are included in source set 122. The subset X includes the 7-bit words x that have a Hamming weight equal to 3 or 4, except the words 0000111 and 1111000. The subset X' includes the 7-bit words x that have a Hamming weight equal to 0, 1, 2, 5, 6, or 7 and the words 0000111 and 1111000.

The 7/8 code maps the 7-bit words x to a set W of 8-bit words w. The set W includes all 8-bit words having leading and trailing runlengths of at most three. That is, the set W excludes 8-bit words that begin or end with four 1's or four 0's, i.e. 0000XXXX, 1111XXXX, XXXX0000, and XXXX1111. The set W therefore contains 196 8-bit words.

The set W includes a subset $W_-$ and a subset $W_+$. The subset $W_-$ includes the 8-bit words w with a Hamming weight less than or equal to 4. The set $W_+$ includes only the 8-bit words w with a Hamming weight greater than or equal to 4. The 8-bit words w that have a Hamming weight equal to 4 belong to an intersecting set 124 of subset $W_-$ and subset $W_+$. FIG. 4 depicts a table 130 that shows how many 8-bit words in W have particular Hamming weights.

The subset $W_-$ and the subset $W_+$ each include 132 8-bit words. Observe that $|W_-|=|W_+|=132\geq 128$. Therefore, two functions $f_-$ and $f_+$ can map any 7-bit word x to a corresponding 8 bit word w. The functions $f_-$ and $f_+$ are one-to-one and the ranges of functions $f_-$ and $f_+$ are contained in the subsets $W_-$ and $W_+$, respectively. If a word w is in the ranges of $f_-$ and $f_+$, then $f_-^{-1}(w)=f_+^{-1}(w)$. Referring briefly to FIG. 3, the functions $f_-$ and $f_+$ are implemented by the combinations of functions $\bar{h}$ and g, and h and g, respectively.

Figure 5:
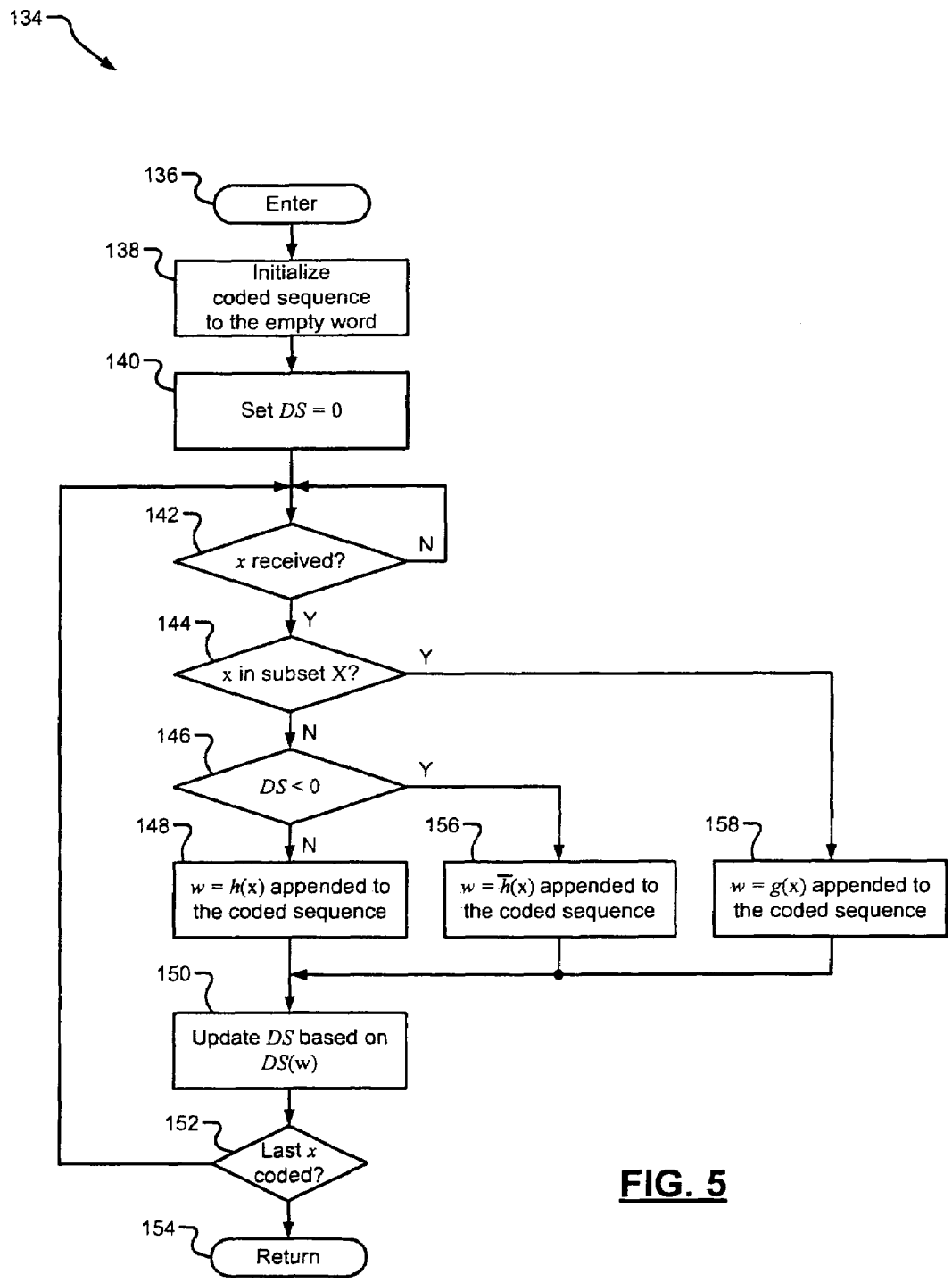
FIG. 5 is flowchart of a method of implementing the 7/8 code.

Referring now to FIG. 5, a flowchart 134 provides an overview of the encoding process for the 7/8 code. Control enters via block 136 and immediately proceeds to block 138 and initializes a coded sequence to the empty word. Control then proceeds to block 140 and resets a cumulative digital sum. Control then proceeds to decision block 142 and waits to receive a 7-bit word x. Upon receiving a 7-bit word x, control branches to decision block 144 and determines whether the 7-bit word x is in subset X. If so, then the 7-bit word x is inherently run-length limited and control branches to block 158. In block 158 control employs the function g(x) to form the corresponding 8-bit word w. The function g(x) is explained below. Control then branches to block 150 and updates the cumulative digital sum based on the digital sum of the new 8-bit word w. Control then branches to block 152 and determines whether there is another 7-bit word x that needs to be encoded. If so, then control branches back to decision block 142 and waits for the next 7-bit word x. If not, then control branches from decision block 152 to return block 154 and returns to other processes.

Returning now to decision block 144, if the 7-bit word x is not in the subset X, (i.e. the 7-bit word is in the subset X' by default), then control branches to decision block 146 and determines if the present value of the cumulative digital sum is less than zero. If so, then control branches to block 156 and generates the corresponding 8-bit word w based on the function $\bar{h}(x)$. The function $\bar{h}(x)$ is chosen to generate 8-bit words w that increase the cumulative digital sum and have a run length of at most 4. An example function $\bar{h}(x)$ is described below. From block 156 control branches to block 150 and updates the cumulative digital sum based the new 8-bit word w.

Returning now to decision block 146, if the present value of the cumulative digital sum is greater than or equal to zero then control branches to block 148 and generates the corresponding 8-bit word w based on the function h(x). The function h(x) is chosen to generate 8-bit words w that reduce the cumulative digital sum and have a run length of at most 4. An example function h(x) is described below. From block 148 control branches to block 150 and updates the cumulative digital sum based the new 8-bit word w.

Encoding

The functions g(x), h(x), and $\bar{h}(x)$ are chosen to simultaneously satisfy the selected runlength limit and be DC-free. Recalling from FIG. 3 that the function g(x) is employed to encode the 7-bit words x that are inherently runlength limited, the function g(x) can be implemented to provide the DC-free condition. An example of such a g(x) can be piecewise implemented by g(x)=x1 (i.e. append a 1 to a to the 7-bit word x) when H(x)=3 and g(x)=x0 (i.e. append a 0 to a to the 7-bit word x) when H(x)=4.

An implementation of the functions h(x) and $\bar{h}(x)$ will now be described. First, the 7-bit word x is mapped to a variable y based on the function y=x for $H(x)\leq 3$ and y=$\bar{x}$ for $H(x)\geq 4$. A variable d is also set to 1 if $H(x)\geq 4$ and set to 0 otherwise. The functions h(x) and $\bar{h}(x)$ can then be completed by looking up a new 8-bit word x in a table shown that is shown in FIG. 6. A first column 160 shows lists the possible input combinations of the variable y. A second column 162 and a third column 164 provide corresponding values of h(x) when d=0 and d=1, respectively. The table of FIG. 6 can be implemented in first and second 7/8 lookup tables 112,114.

Figure 7:
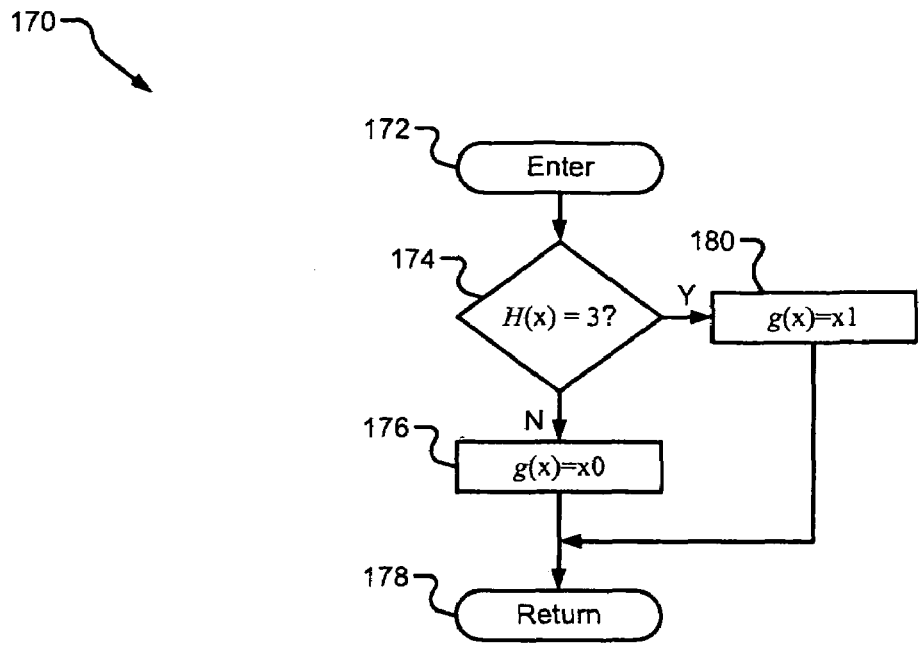
FIG. 7 is a method of encoding a first subset of 7-bit words.

Referring now to FIG. 7, a flowchart 170 shows a logical implementation of the function g(x) that was described above. The logic of flowchart 170 can be implemented by TX PHY 108 and executed when a 7-bit word x is a member of the subset X.

Control enters via block 172 and immediately proceeds to decision block 174. In decision block 174 control determines whether H(x) is equal to 3. If so, then control branches to block 180 and implements g(x) by appending a 1 to x. If H(x) is not equal to 3 in decision block 174 then control can assume that H(x) is equal to 4 (since x is a member of the subset X) and implement g(x) by branching to block 176 to append a 0 to the 7-bit word x. Control returns to other processes via exit block 178 after appending the 0 or 1 in blocks 176 and 180, respectively.

Figure 8:
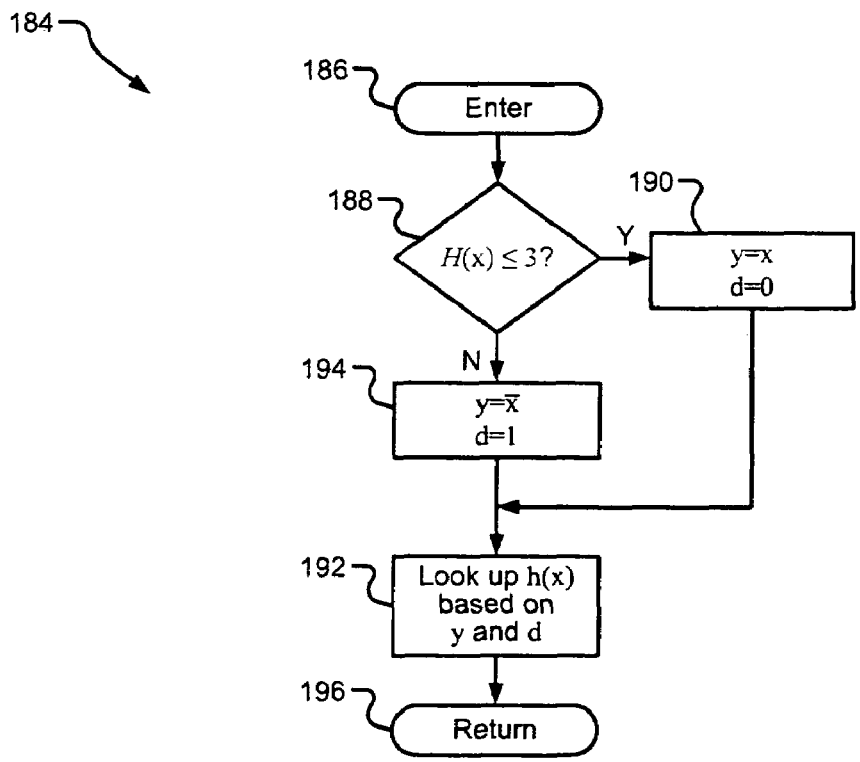
FIG. 8 is a method of encoding a second subset of 7-bit words.

Referring now to FIG. 8, a flowchart 184 shows a logical implementation of the functions h(x) that are described above. The logic of flowchart 184 can be implemented by TX PHY 108 and executed when a 7-bit word x is a member of the subset X'.

Control enters via block 186 and immediately proceeds to decision block 188. In decision block 188 control determines whether H(x) is less than or equal to 3. If so, then control branches to block 190 to set the variable y equal to x and sets the variable d equal to 0. Control then branches to block 192 and looks up h(x) in the table of FIG. 6 based on the variables y and d. If H(x) is not less than or equal to 3 in decision block 188 then control can assume that H(x) is greater than or equal to 4 and therefore branch to block 194. In block 194 control sets the variable y equal to the inverse of x and sets the variable d equal to 1. Control then branches to block 192 and looks up h(x) in the table of FIG. 6 based on the variables y and d. Control then returns to other processes via exit block 196.

Figure 9:
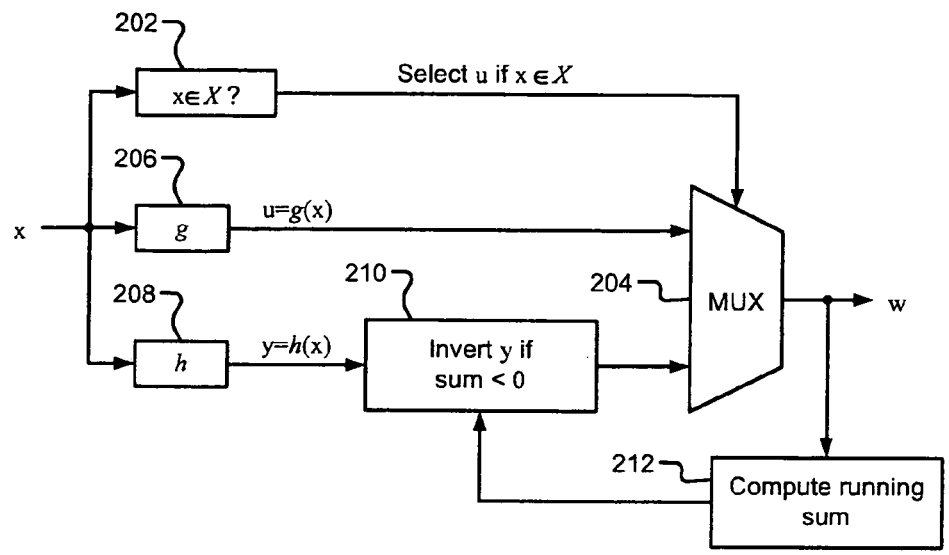
FIG. 9 is a functional block diagram of transmit physical layer module (PHY) that implements the 7/8 bit encoding method.

Referring now to FIG. 9, a functional block diagram is shown of TX PHY 108. TX PHY 108 includes a determination module 202 that receives a 7-bit word x that will be encoded. Determination module 202 generates a multiplexer control signal based on whether x is a member of the subset X. A first module 206 and second module 208 simultaneously receive the 7-bit word x. First module 206 generates an output signal u based on the function g(x). Second module 208 generates an output signal y based on the function h(x). An inverter module 210 inverts the bits of y if a present value of the cumulative digital sum is less than zero. A multiplexer 204 routes one of the signals u and y (or the inverse of y) based on the multiplexer control signal to the 8-bit output word w. A third module 212 updates the cumulative digital sum based on the new 8-bit word w.

Decoding

Figure 10:
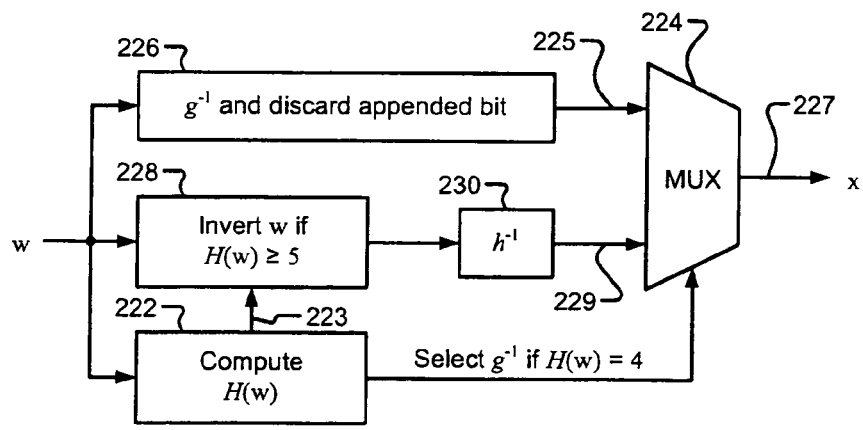
FIG. 10 is a functional block diagram of receive PHY that implements an 8/7 bit decoding method.

Referring now to FIG. 10, a functional block diagram is shown of RX PHY 110. RX PHY 110 includes a determination module 222 that receives an 8-bit word w that will be decoded. Determination module 222 generates a first control signal 223 and a multiplexer control signal based on H(w). A multiplexer 224 routes a signal from a first input 225 to an output 227 when H(w) is equal to 4 (i.e. w maps back to a 7-bit word x that is a member of the subset X.) If H(w) is unequal to 4 then multiplexer 224 routes a signal from a second input 229 to output 227. The first control signal 223 indicates when H(w) is greater than or equal to five.

A first module 226 and second module 228 simultaneously receive the 8-bit word x. First module 226 generates an output signal based on $g^{-1}(x)$ and discarding the bit that was appended by TX PHY 108 (see flowchart 170 of FIG. 7). An output of first module 226 is communicated to first input 225 of multiplexer 224.

Second module 228 selectively inverts w based on the first control signal 223 and then communicates the result to a third module 230. Third module 230 generates an output signal based on $h^{-1}(x)$. The output signal of third module 230 is communicated to the second input 229 of multiplexer 224. The output 227 of multiplexer 224 provides the decoded 7-bit word x based on the multiplexer control signal in the signals at first input 225 and second input 229.

Synchronization

TX PHY 108 can periodically insert a sync word into the coded sequence of 8-bit words x. RX PHY 110 can then synchronize with the incoming stream of 8-bit words x based on the inserted sync words.

The sync word may be chosen such that it satisfies the runlength constraint and has zero disparity (number of 0's=number of 1's). However, it is possible that the sync word pattern may appear in the coded data. If there is a timing problem and re-sync is needed, then there is a chance that the sync word is detected incorrectly. Thus, a sync word may be chosen that violates the runlength constraint. Examples of sync words are v=00000001 and w=111111110. TX PHY 108 inserts v if the cumulative digital sum is greater than or equal to zero and inserts w if the cumulative digital sum is less than zero. These sync words increase maximum runlength from 6 to 10. Degradation of maximum runlength can be reduced if longer sync words are used, such as v=100000001 and w=011111110. However, the length of these sync words (9 bits) is not as convenient to implement since the block length of the code is 8. Another choice is to use single 16-bit DC-free word such as 1110000000110111.

Exemplary Implementations

Figure 11A:
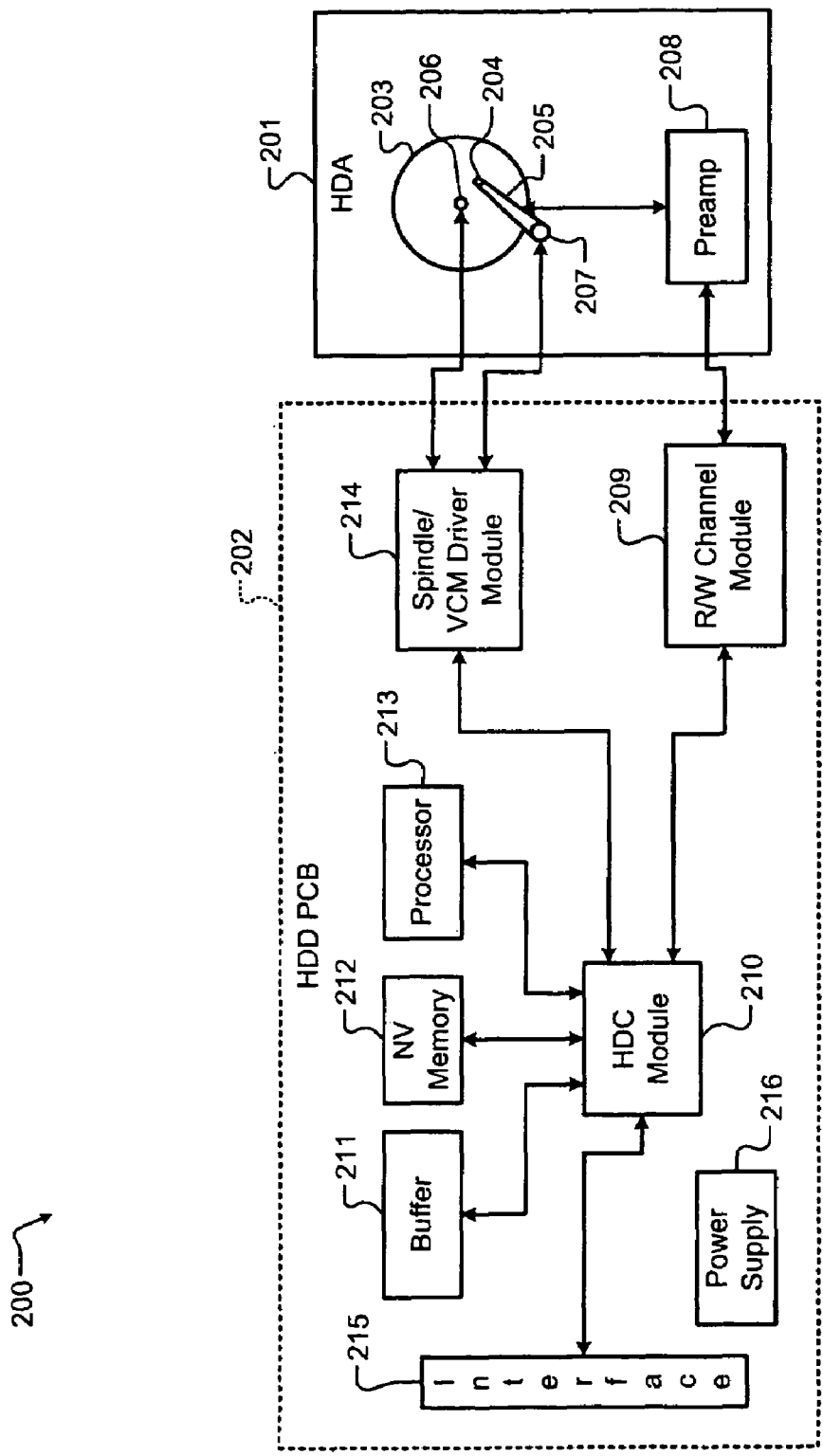
FIG. 11A is a functional block diagram of a hard disk drive.

Referring now to FIG. 11A, the teachings of the disclosure can be implemented in a read/write channel module (hereinafter, "read channel") 209 of a hard disk drive (HDD) 200. The HDD 200 includes a hard disk assembly (HDA) 201 and a HDD PCB 202. The HDA 201 may include a magnetic medium 203, such as one or more platters that store data, and a read/write device 204. The read/write device 204 may be arranged on an actuator arm 205 and may read and write data on the magnetic medium 203. Additionally, the HDA 201 includes a spindle motor 206 that rotates the magnetic medium 203 and a voice-coil motor (VCM) 207 that actuates the actuator arm 205. A preamplifier device 208 amplifies signals generated by the read/write device 204 during read operations and provides signals to the read/write device 204 during write operations.

The HDD PCB 202 includes the read channel 209, a hard disk controller (HDC) module 210, a buffer 211, nonvolatile memory 212, a processor 213, and a spindle/VCM driver module 214. The read channel 209 processes data received from and transmitted to the preamplifier device 208 in accordance with the 28/30 DC-free RLL code. The HDC module 210 controls components of the HDA 201 and communicates with an external device (not shown) via an I/O interface 215. The external device may include a computer, a multimedia device, a mobile computing device, etc. The I/O interface 215 may include wireline and/or wireless communication links.

The HDC module 210 may receive data from the HDA 201, the read channel 209, the buffer 211, nonvolatile memory 212, the processor 213, the spindle/VCM driver module 214, and/or the I/O interface 215. The processor 213 may process the data, including encoding, decoding, filtering, and/or formatting. The processed data may be output to the HDA 201, the read channel 209, the buffer 211, nonvolatile memory 212, the processor 213, the spindle/VCM driver module 214, and/or the I/O interface 215.

The HDC module 210 may use the buffer 211 and/or nonvolatile memory 212 to store data related to the control and operation of the HDD 200. The buffer 211 may include DRAM, SDRAM, etc. The nonvolatile memory 212 may include flash memory (including NAND and NOR flash memory), phase change memory, magnetic RAM, or multi-state memory, in which each memory cell has more than two states. The spindle/VCM driver module 214 controls the spindle motor 206 and the VCM 207. The HDD PCB 202 includes a power supply 216 that provides power to the components of the HDD 200.

Figure 11B:
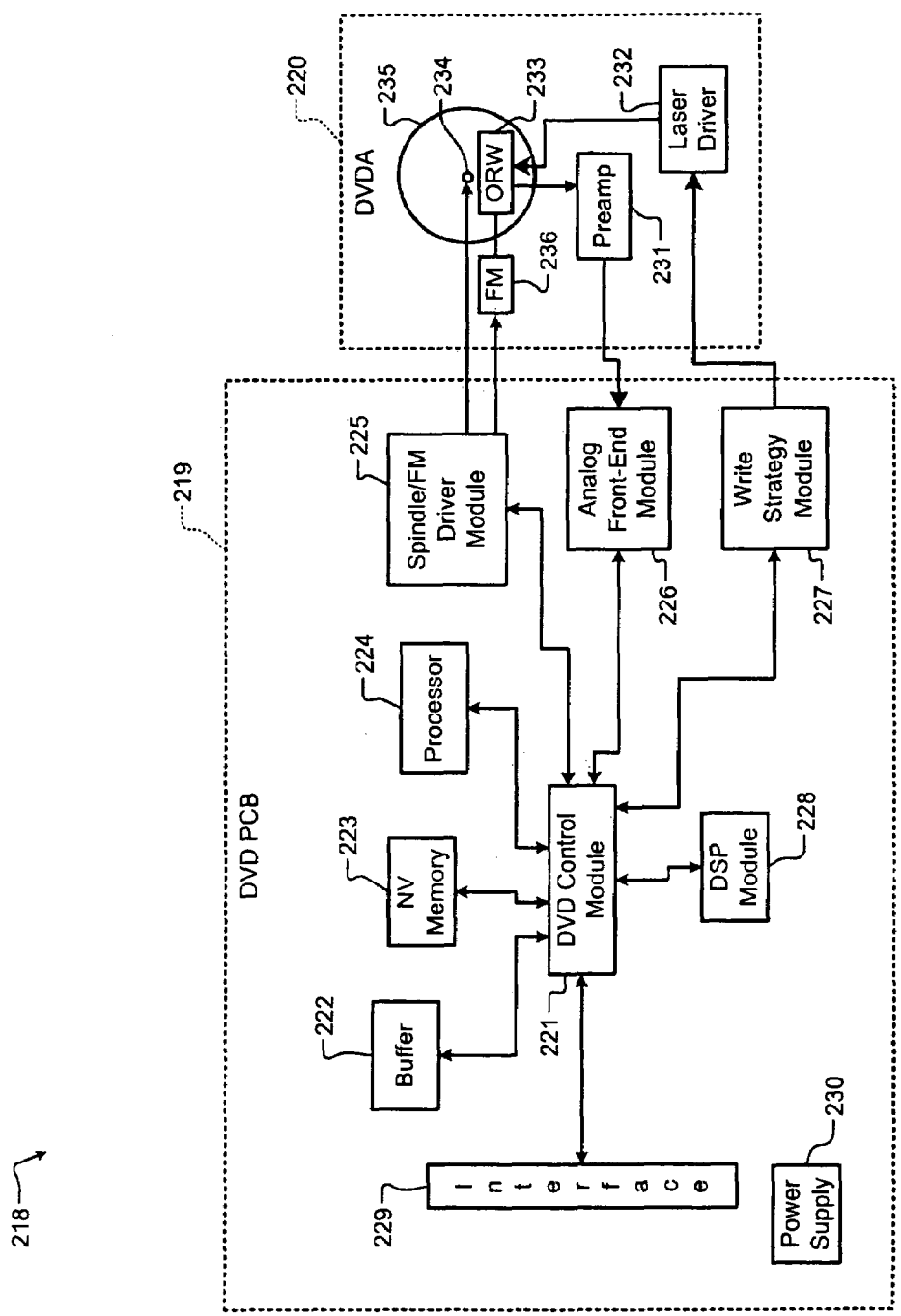
FIG. 11B is a functional block diagram of a DVD drive.

Referring now to FIG. 11B, the teachings of the disclosure can be implemented in a processor 224 of a DVD drive 218 or of a CD drive (not shown). The DVD drive 218 includes a DVD PCB 219 and a DVD assembly (DVDA) 220. The DVD PCB 219 includes a DVD control module 221, a buffer 222, nonvolatile memory 223, the processor 224, a spindle/FM (feed motor) driver module 225, an analog front-end module 226, a write strategy module 227, and a DSP module 228.

The DVD control module 221 controls components of the DVDA 220 and communicates with an external device (not shown) via an I/O interface 229. The external device may include a computer, a multimedia device, a mobile computing device, etc. The I/O interface 229 may include wireline and/or wireless communication links.

The DVD control module 221 may receive data from the buffer 222, nonvolatile memory 223, the processor 224, the spindle/FM driver module 225, the analog front-end module 226, the write strategy module 227, the DSP module 228, and/or the I/O interface 229. The processor 224 may encode and decode the data in accordance with the 28/30 DC-free RLL code. The processor 224 may also process the data, including filtering, and/or formatting. The DSP module 228 performs signal processing, such as video and/or audio coding/decoding. The processed data may be output to the buffer 222, nonvolatile memory 223, the processor 224, the spindle/FM driver module 225, the analog front-end module 226, the write strategy module 227, the DSP module 228, and/or the I/O interface 229.

The DVD control module 221 may use the buffer 222 and/or nonvolatile memory 223 to store data related to the control and operation of the DVD drive 218. The buffer 222 may include DRAM, SDRAM, etc. The nonvolatile memory 223 may include flash memory (including NAND and NOR flash memory), phase change memory, magnetic RAM, or multi-state memory, in which each memory cell has more than two states. The DVD PCB 219 includes a power supply 230 that provides power to the components of the DVD drive 218.

The DVDA 220 may include a preamplifier device 231, a laser driver 232, and an optical device 233, which may be an optical read/write (ORW) device or an optical read-only (OR) device. A spindle motor 234 rotates an optical storage medium 235, and a feed motor 236 actuates the optical device 233 relative to the optical storage medium 235.

When reading data from the optical storage medium 235, the laser driver provides a read power to the optical device 233. The optical device 233 detects data from the optical storage medium 235, and transmits the data to the preamplifier device 231. The analog front-end module 226 receives data from the preamplifier device 231 and performs such functions as filtering and A/D conversion. To write to the optical storage medium 235, the write strategy module 227 transmits power level and timing data to the laser driver 232. The laser driver 232 controls the optical device 233 to write data to the optical storage medium 235.

Figure 11D:
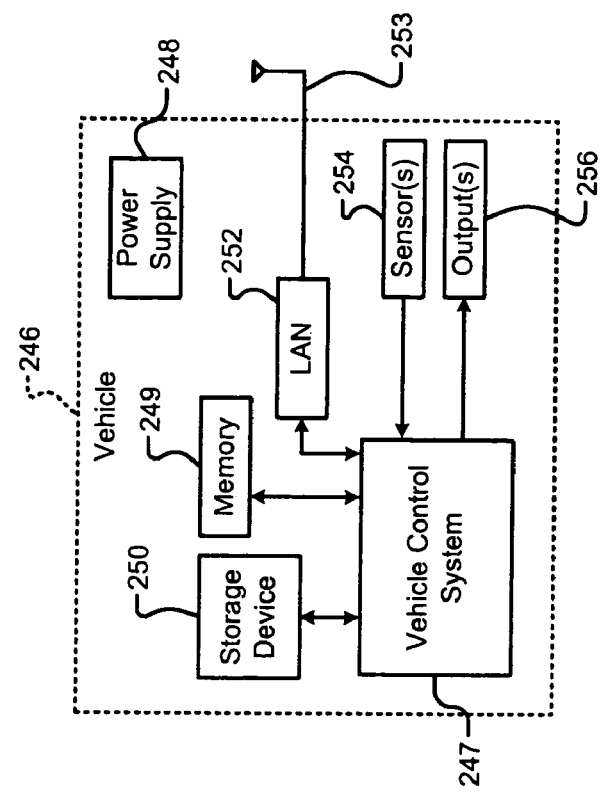
FIG. 11D is a functional block diagram of a vehicle control system.
Figure 11C:
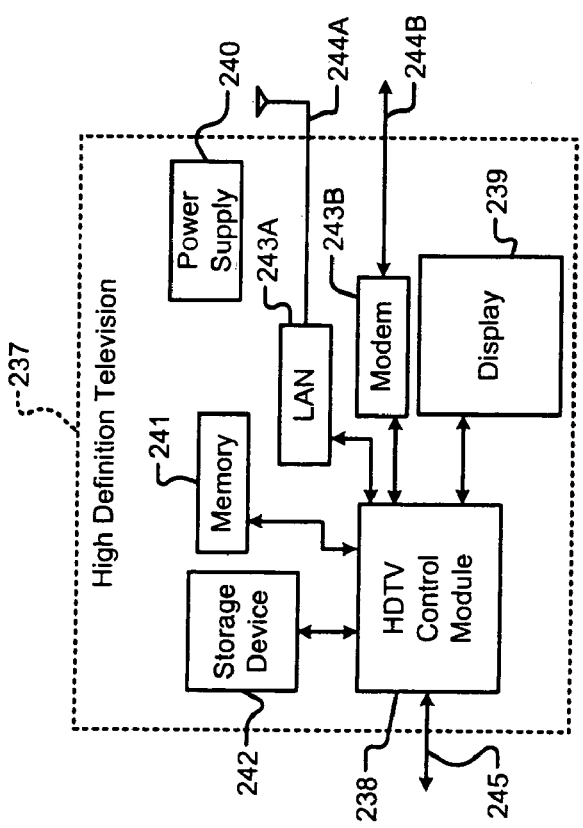
FIG. 11C is a functional block diagram of a high definition television.

Referring now to FIG. 11C, the teachings of the disclosure can be implemented in a LAN interface 243A and/or a modem 243B of a high definition television (HDTV) 237. The modem 243B can be a DSL modem or a cable modem. The HDTV 237 includes a HDTV control module 238, a display 239, a power supply 240, memory 241, a storage device 242, the LAN interface 243A and associated wired or wireless media 244A, the modem 243A, and an external interface 245. The modem 243B communicates with a telephone or cable television cable 244B.

The HDTV 237 can receive input signals from the LAN interface 243A, the modem 243B and/or the external interface 245, which send and receive information via cable, wired or wireless broadband Internet, and/or satellite. The HDTV control module 238 may process the input signals, including encoding, decoding, filtering, and/or formatting, and generate output signals. The output signals may be communicated to one or more of the display 239, memory 241, the storage device 242, the LAN interface 243A, the modem 243B, and the external interface 245.

Memory 241 may include random access memory (RAM) and/or nonvolatile memory such as flash memory, phase change memory, or multi-state memory, in which each memory cell has more than two states. The storage device 242 may include an optical storage drive, such as a DVD drive, and/or a hard disk drive (HDD). The HDTV control module 238 communicates externally via the LAN interface 243A, the modem 243B, and/or the external interface 245. The power supply 240 provides power to the components of the HDTV 237.

Referring now to FIG. 11D, the teachings of the disclosure may be implemented in a LAN interface 252 of a vehicle 246. The vehicle 246 may include a vehicle control system 247, a power supply 248, memory 249, a storage device 250, and the LAN interface 252. The LAN interface 252 may be wired and/or wireless and include an antenna 253. The vehicle control system 247 may be a powertrain control system, a body control system, an entertainment control system, an anti-lock braking system (ABS), a navigation system, a telematics system, a lane departure system, an adaptive cruise control system, and the like.

The vehicle control system 247 may communicate with one or more sensors 254 and generate one or more output signals 256. The sensors 254 may include temperature sensors, acceleration sensors, pressure sensors, rotational sensors, airflow sensors, etc. The output signals 256 may control engine operating parameters, transmission operating parameters, suspension parameters, etc.

The power supply 248 provides power to the components of the vehicle 246. The vehicle control system 247 may store data in memory 249 and/or the storage device 250. Memory 249 may include random access memory (RAM) and/or nonvolatile memory such as flash memory, phase change memory, or multi-state memory, in which each memory cell has more than two states. The storage device 250 may include an optical storage drive, such as a DVD drive, and/or a hard disk drive (HDD). The vehicle control system 247 may use the LAN interface 252 to communicate with other vehicles and/or land-based communications infrastructure.

Figure 11F:
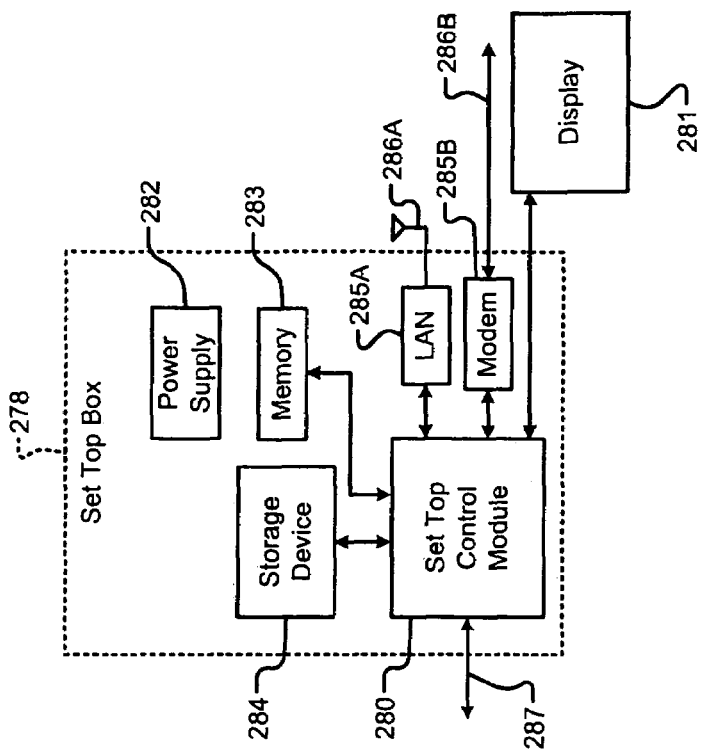
FIG. 11F is a functional block diagram of a set top box.
Figure 11E:
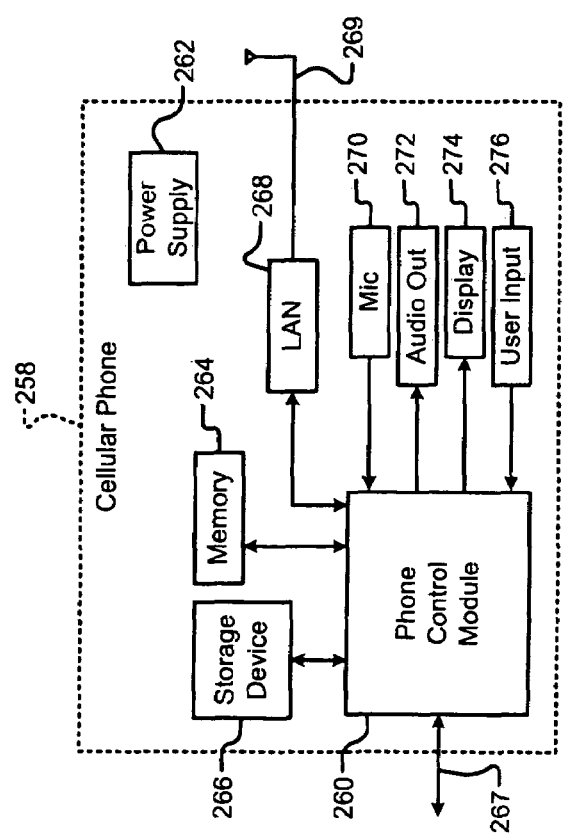
FIG. 11E is a functional block diagram of a cellular phone.

Referring now to FIG. 11E, the teachings of the disclosure can be implemented in a LAN interface 268 of a cellular phone 258. The cellular phone 258 includes a phone control module 260, a power supply 262, memory 264, a storage device 266, a cellular network interface 267, the LAN interface 268, a microphone 270, an audio output 272 such as a speaker and/or output jack, a display 274, and a user input device 276 such as a keypad and/or pointing device. The LAN interface may communicate over wired media and wireless media with an associated antenna 269.

The phone control module 260 may receive input signals from the cellular network interface 267, the LAN interface 268, the microphone 270, and/or the user input device 276. The phone control module 260 may process signals, including encoding, decoding, filtering, and/or formatting, and generate output signals. The output signals may be communicated to one or more of memory 264, the storage device 266, the cellular network interface 267, the LAN interface 268, and the audio output 272.

Memory 264 may include random access memory (RAM) and/or nonvolatile memory such as flash memory, phase change memory, or multi-state memory, in which each memory cell has more than two states. The storage device 266 may include an optical storage drive, such as a DVD drive, and/or a hard disk drive (HDD). The power supply 262 provides power to the components of the cellular phone 258.

Referring now to FIG. 11F, the teachings of the disclosure can be implemented in a LAN interface 285A and/or a modem 285B of a set top box 278. The modem 285B can be a DSL modem or a cable modem. The set top box 278 includes a set top control module 280, a display 281, a power supply 282, memory 283, a storage device 284, the LAN interface 285A and the modem 285B. The LAN interface 285A may communicate over wired media and wireless media with an associated antenna 286A. The modem 285B may communicate over a telephone or cable television cable 286B.

The set top control module 280 may receive input signals from the LAN interface 285 and an external interface 287, which can send and receive information via cable, broadband Internet, and/or satellite. The set top control module 280 may process signals, including encoding, decoding, filtering, and/or formatting, and generate output signals. The output signals may include audio and/or video signals in standard and/or high definition formats. The output signals may be communicated to the LAN interface 285A, the modem 285B, and/or to the display 281. The display 281 may include a television, a projector, and/or a monitor.

The power supply 282 provides power to the components of the set top box 278. Memory 283 may include random access memory (RAM) and/or nonvolatile memory such as flash memory, phase change memory, or multi-state memory, in which each memory cell has more than two states. The storage device 284 may include an optical storage drive, such as a DVD drive, and/or a hard disk drive (HDD).

Figure 11G:
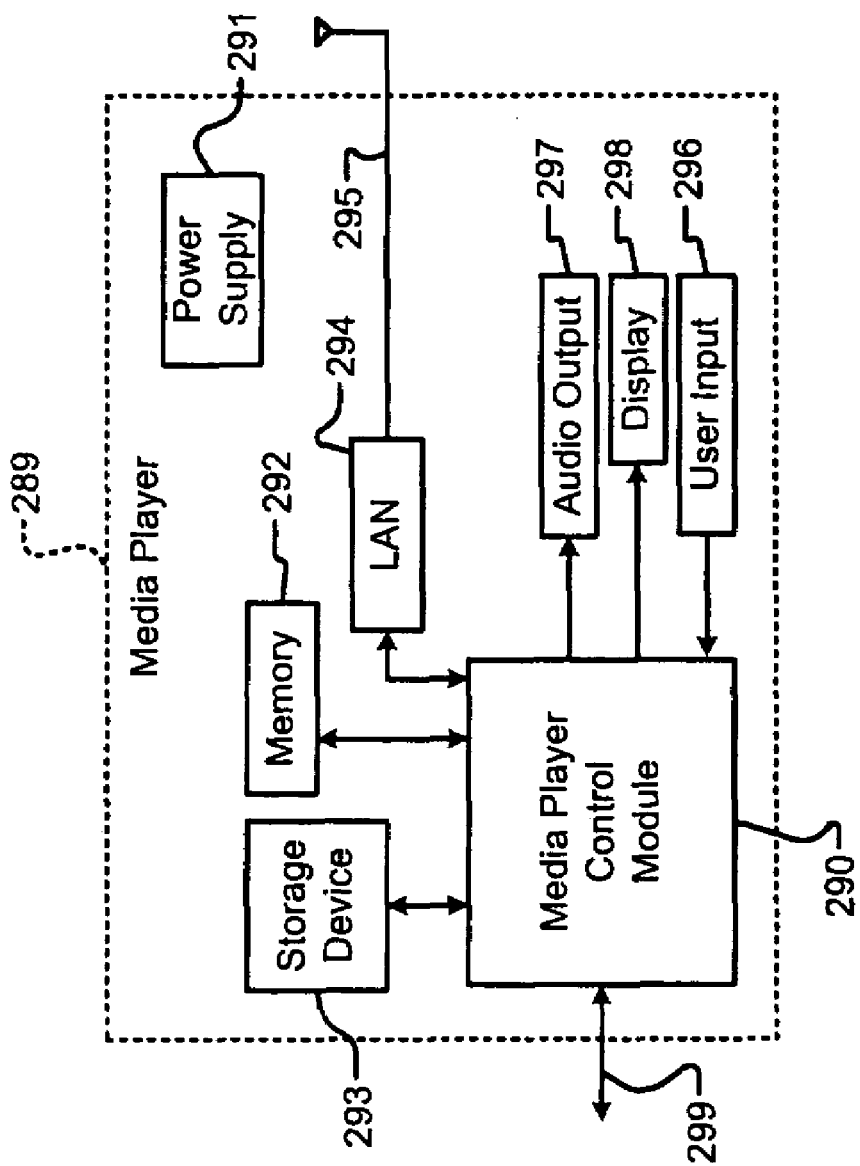
FIG. 11G is a functional block diagram of a mobile device.

Referring now to FIG. 11G, the teachings of the disclosure can be implemented in a LAN interface 294 of a mobile device 289. The mobile device 289 may include a mobile device control module 290, a power supply 291, memory 292, a storage device 293, the LAN interface 294, and an external interface 299. The LAN interface 294 may communicate over wired media and over wireless media with an associated antenna 295.

The mobile device control module 290 may receive input signals from the LAN interface 294 and/or the external interface 299. The external interface 299 may include USB, infrared, and/or Ethernet. The input signals may include compressed audio and/or video, and may be compliant with the MP3 format. Additionally, the mobile device control module 290 may receive input from a user input 296 such as a keypad, touchpad, or individual buttons. The mobile device control module 290 may process input signals, including encoding, decoding, filtering, and/or formatting, and generate output signals.

The mobile device control module 290 may output audio signals to an audio output 297 and video signals to a display 298. The audio output 297 may include a speaker and/or an output jack. The display 298 may present a graphical user interface, which may include menus, icons, etc. The power supply 291 provides power to the components of the mobile device 289. Memory 292 may include random access memory (RAM) and/or nonvolatile memory such as flash memory, phase change memory, or multi-state memory, in which each memory cell has more than two states. The storage device 293 may include an optical storage drive, such as a DVD drive, and/or a hard disk drive (HDD). The mobile device may include a personal digital assistant, a media player, a gaming console or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A run-length limited (RLL) DC-free encoder, comprising:
   a determination module that receives input words and that determines whether each input word is a member of one of a first input set and a second input set,
   a first mapping module that maps the first ones of the input words of the first input set to corresponding output words that are run-length limited and DC-free;
   a second mapping module that maps the second ones of the input words of the second input set to corresponding output words that are run-length limited and have a negative digital sum; and
   an inverter module that selectively inverts the output words from the second mapping module based on a cumulative digital sum of the output words.

2. The encoder of claim 1 wherein the second mapping module determines the Hamming weight of each of the second ones of the input words of the second input set and maps each of the second ones of the input words to the corresponding output word based on the Hamming weight of the input word.

3. The encoder of claim 1 wherein the output words are encoded in a non-return to zero (NRZ) format.

4. The encoder of claim 1 wherein the input words are 7-bit words and the output words are 8-bit words.

5. The encoder of claim 4 wherein the first mapping module appends one of a 1 and a 0 to each 7-bit word in the first input set based on the Hamming weight of the 7-bit word.

6. The encoder of claim 5 wherein the second mapping module includes a table of functions that is indexed by variables y and d, wherein the second mapping module sets y=x and d=0 when H(x) is less than or equal to three and sets y=$\bar{x}$ and d=1 when H(x) is greater than or equal to four and maps y to one of the output words based on the function selected from the table based on y and d, wherein x is one of the 7-bit words, and wherein H(x) is the Hamming weight of x.

7. The encoder of claim 1 wherein the first and second mapping modules employ respective block codes.

8. A decoder comprising:
   a determination module that receives encoded input words and that determines whether a Hamming weight of the input words is equal to a predetermined Hamming weight;
   a first mapping module that maps the input words to first corresponding output words when the Hamming weights of the input words are equal to the predetermined Hamming weight; and
   a second mapping module that maps the input words to second corresponding output words when the Hamming weights of the input words are not equal to the predetermined Hamming weight.

9. The decoder of claim 8 wherein the second mapping module includes an inverter that inverts the input words when the Hamming weights of the input words exceeds the predetermined Hamming weight.

10. The decoder of claim 9 wherein the second mapping module maps the inverted input words to the corresponding output words when the Hamming weights of the input words exceed the predetermined Hamming weight.

11. The decoder of claim 8 wherein the output words are encoded in a non-return to zero (NRZ) format.

12. The decoder of claim 8 wherein the input words are 8-bit words and the output words are 7-bit words.

13. The decoder of claim 8 wherein the first mapping module deletes a predetermined bit from the input words.

14. The decoder of claim 13 wherein the first mapping module selectively inverts remaining bits of the input words based on the deleted bit.

15. The decoder of claim 8 wherein the first and second mapping modules employ respective block codes.

16. A run-length limited (RLL) DC-free encoding method, comprising:
   receiving input words and determining whether each input word is a member of one of a first input set and a second input set,
   mapping the first ones of the input words of the first input set to corresponding output words that are run-length limited and DC-free;
   mapping the second ones of the input words of the second input set to corresponding output words that are run-length limited and have a negative digital sum; and selectively inverting the output words from the second mapping module based on a cumulative digital sum of the output words.

17. The method of claim 16 further comprising determining the Hamming weight of each of the second ones of the input words of the second input set and mapping each of the second ones of the input words to the corresponding output word based on the Hamming weight of the input word.

18. The method of claim 16 wherein the output words are encoded in a non-return to zero (NRZ) format.

19. The method of claim 16 wherein the input words are 7-bit words and the output words are 8-bit words.

20. The method of claim 19 further comprising appending one of a 1 and a 0 to each 7-bit word in the first input set based on the Hamming weight of the 7-bit word.

21. The method of claim 20 wherein mapping the second ones of the input words includes employing a table of functions that is indexed by variables y and d, setting y=x and d=0 when H(x) is less than or equal to three and setting y=$\bar{x}$ and d=1 when H(x) is greater than or equal to four, and mapping y to one of the output words based on the function selected from the table based on y and d, wherein x is one of the 7-bit words, and wherein H(x) is the Hamming weight of x.

22. The method of claim 16 wherein the each of the mapping steps employ respective block codes.

23. A decoding method, comprising:
receiving encoded input words;
determining whether Hamming weights of the input words are equal to a predetermined Hamming weight;
mapping the input words to first corresponding output words when the Hamming weights of the input words are equal to the predetermined Hamming weight; and
mapping the input words to second corresponding output words when the Hamming weights of the input words are not equal to the predetermined Hamming weight.

24. The method of claim 23 further comprising inverting the input words when the Hamming weights of the input words exceed the predetermined Hamming weight.

25. The method of claim 24 further comprising mapping the inverted input words to the corresponding output words when the Hamming weights of the input words exceed the predetermined Hamming weight.

26. The method of claim 23 wherein the output words are encoded in a non-return to zero (NRZ) format.

27. The method of claim 23 wherein the input words are 8-bit words and the output words are 7-bit words.

28. The method of claim 23 further comprising deleting a predetermined bit from the input words.

29. The method of claim 28 further comprising selectively inverting remaining bits of the input words based on the deleted bit.

30. The method of claim 23 wherein the mapping steps employ respective block codes.

31. A run-length limited (RLL) DC-free encoder, comprising:
determination means for receiving input words and determining whether each input word is a member of one of a first input set and a second input set,
first mapping means for mapping the first ones of the input words of the first input set to corresponding output words that are run-length limited and DC-free;
second mapping means for mapping the second ones of the input words of the second input set to corresponding output words that are run-length limited and have a negative digital sum; and
inverter means for selectively inverting the output words from the second mapping module based on a cumulative digital sum of the output words.

32. The encoder of claim 31 wherein the second mapping means determines the Hamming weight of each of the second ones of the input words of the second input set and maps each of the second ones of the input words to the corresponding output word based on the Hamming weight of the input word.

33. The encoder of claim 31 wherein the output words are encoded in a non-return to zero (NRZ) format.

34. The encoder of claim 31 wherein the input words are 7-bit words and the output words are 8-bit words.

35. The encoder of claim 34 wherein the first mapping means appends one of a 1 and a 0 to each 7-bit word in the first input set based on the Hamming weight of the 7-bit word.

36. The encoder of claim 35 wherein the second mapping means includes a table of functions that is indexed by variables y and d, wherein the second mapping means sets y=x and d=0 when H(x) is less than or equal to three and sets y=$\bar{x}$ and d=1 when H(x) is greater than or equal to four and maps y to one of the output words based on the function selected from the table based on y and d, wherein x is one of the 7-bit words, and wherein H(x) is the Hamming weight of x.

37. The encoder of claim 31 wherein the first and second mapping means employ respective block codes.

38. A decoder comprising:
determination means for receiving encoded input words and determining whether Hamming weights of the input words are equal to a predetermined Hamming weight;
first mapping means for mapping the input words to first corresponding output words when the Hamming weights of the input words are equal to the predetermined Hamming weight; and
second mapping means for mapping the input words to second corresponding output words when the Hamming weights of the input words are not equal to the predetermined Hamming weight.

39. The decoder of claim 38 wherein the second mapping means includes inverter means for inverting the input words when the Hamming weights of the input words exceeds the predetermined Hamming weight.

40. The decoder of claim 39 wherein the second mapping means maps the inverted input words to the corresponding output words when the Hamming weights of the input words exceed the predetermined Hamming weight.

41. The decoder of claim 38 wherein the output words are encoded in a non-return to zero (NRZ) format.

42. The decoder of claim 38 wherein the input words are 8-bit words and the output words are 7-bit words.

43. The decoder of claim 38 wherein the first mapping means deletes a predetermined bit from the input words.

44. The decoder of claim 43 wherein the first mapping means selectively inverts remaining bits of the input words based on the deleted bit.

45. The decoder of claim 38 wherein the first and second mapping means employ respective block codes.

46. The encoder of claim 1 wherein the determination module determines whether each of the input words is a member of one of the d first input set and the second input set based on Hamming weight of the input words.

47. The encoder of claim 1 wherein the second mapping module maps the second ones of the input words of the second input set to corresponding output words that have a positive digital sum.

48. The decoder of claim 8 wherein the input words are encoded and the output words are decoded.

49. The decoder of claim 8 wherein the first mapping module maps the input words to the first corresponding output words when a digital sum of the input words is equal to zero (0).

50. The decoder of claim 8 wherein the second mapping module maps the input words to the second corresponding output words when a digital sum of the input words is not equal to zero (0).

* * * * *

UNITED STATES PATENT AND TRADEMARK OFFICE
CERTIFICATE OF CORRECTION

PATENT NO. : 7,425,907 B1 Page 1 of 1
APPLICATION NO. : 11/649486
DATED : September 16, 2008
INVENTOR(S) : Panu Chalchanavong et al.

It is certified that error appears in the above-identified patent and that said Letters Patent is hereby corrected as shown below:

| | |
|---|---|
| Column 2, Line 5 | Insert -- $\bar{x}$ -- after "$y =$" |
| Column 2, Line 57 | Insert -- $\bar{x}$ -- after "$y =$" |
| Column 3, Line 41 | Insert -- $\bar{x}$ -- after "$y =$" |
| Column 4, Line 31 | Insert -- $\bar{x}$ -- after "$y =$" |
| Column 7, Line 57 | Insert -- on -- after "based" |
| Column 7, Line 67 | Insert -- on -- after "based" |
| Column 8, Line 9 | Delete "a to" after "to" |
| Column 8, Line 10 | Delete "a to" after "to" |
| Column 8, Line 16 | Delete second occurrence of "h(x)" and insert -- $\bar{h}(x)$ -- |
| Column 8, Line 18 | Insert -- of -- after "lists" |
| Column 9, Line 47 | Delete "w=111111110" and insert -- w11111110 -- |

Signed and Sealed this

Second Day of December, 2008

JON W. DUDAS
*Director of the United States Patent and Trademark Office*